(12) United States Patent
Zhang (10) Patent No.: US 7,643,965 B2
(45) Date of Patent: Jan. 5, 2010

(54) EMI MANAGEMENT SYSTEM AND METHOD

(75) Inventor: Tao Zhang, San Diego, CA (US)

(73) Assignee: Olympus Corporation, Hachioji-Shi Tokyo (JP)

( * ) Notice: Subject to any disclaimer, the term of this patent is extended or adjusted under 35 U.S.C. 154(b) by 0 days.

(21) Appl. No.: 11/200,638

(22) Filed: Aug. 10, 2005

(65) Prior Publication Data

US 2007/0038402 A1   Feb. 15, 2007

(51) Int. Cl.
*H04B 15/00* (2006.01)
(52) U.S. Cl. .................................. 702/191
(58) Field of Classification Search ........... 702/117, 702/40, 38, 69, 85, 150, 159, 191, 195; 455/41.2, 455/63.1, 501, 570; 607/9, 17, 63; 128/901
See application file for complete search history.

(56) References Cited

U.S. PATENT DOCUMENTS

| | | | | |
|---|---|---|---|---|
| 5,647,379 A | * | 7/1997 | Meltzer | 128/897 |
| 5,697,958 A | * | 12/1997 | Paul et al. | 607/31 |
| 5,877,630 A | * | 3/1999 | Kraz | 324/511 |
| 5,978,710 A | * | 11/1999 | Prutchi et al. | 607/17 |
| 6,198,968 B1 | * | 3/2001 | Prutchi et al. | 607/9 |
| 6,388,250 B1 | * | 5/2002 | Croydon et al. | 250/252.1 |
| 6,545,852 B1 | * | 4/2003 | Arnold | 361/160 |
| 2002/0190725 A1 | * | 12/2002 | Craven | 324/627 |
| 2004/0066095 A1 | * | 4/2004 | Cherniski et al. | 307/116 |
| 2005/0101359 A1 | * | 5/2005 | O'Mahony | 455/575.5 |
| 2005/0134291 A1 | * | 6/2005 | Kahng et al. | 324/627 |
| 2005/0137827 A1 | * | 6/2005 | Takamiya | 702/150 |
| 2006/0044140 A1 | * | 3/2006 | Berg | 340/573.1 |
| 2006/0132117 A1 | * | 6/2006 | Thomason | 324/96 |

FOREIGN PATENT DOCUMENTS

| | | |
|---|---|---|
| DE | 102004033511 | 9/2006 |
| EP | 0713714 | 5/1996 |
| WO | 9641203 | 12/1996 |
| WO | 9937360 | 7/1999 |
| WO | 2005041453 | 5/2005 |

OTHER PUBLICATIONS

English Translation of DE 10 2004 033511, Feb. 9, 2006.*
English Translation of DE 10 2004033511, Feb. 9, 2006.*

* cited by examiner

*Primary Examiner*—Michael P Nghiem
(74) *Attorney, Agent, or Firm*—Sheppard Mullin Richter & Hampton LLP (57) ABSTRACT

Systems and methods for managing the effect of electromagnetic radiation on electronic devices, are provided. The systems and methods includes determining a location of an electronic device within an environment; determining a level of electromagnetic radiation in a location of interest; and implementing corrective action to limit the effect of the electromagnetic radiation. The location of interest can include at least one of a current location; a future location; and a location that is proximal to the current location of the device. Determining the amount of electromagnetic radiation at a location of interest can include estimating a level of electromagnetic radiation at the location based on equipment stationed at that location; a scheduled use of equipment stationed at that location; and receiving a signal indicating a level of electromagnetic radiation from at least one detector positioned at the location of interest.

35 Claims, 5 Drawing Sheets

EMI MANAGEMENT SYSTEM AND METHOD

FIELD OF THE INVENTION

The present invention relates generally to electromagnetic interference, and more particularly to a system and method for monitoring or managing electromagnetic interference in various environments.

BACKGROUND OF THE INVENTION

Electromagnetic radiation such as that generated from radio frequency transmitters and heterodyne receivers or as emitted by electrical circuits utilizing time varying signals as a by-product of their normal operation, can cause unwanted signals manifested as interference or noise to be induced in other devices. This interference is often referred to as Electromagnetic interference or EMI. EMI, which can be a result of spurious emissions and responses, intermodulation products, and the like can interrupt, obstruct, or otherwise degrade or limit the effective performance of the devices with which they interfere. EMI has long been recognized as a source of interference or disruption to various electrical and electronic devices.

EMI can have significant adverse impacts in a variety of environments, including at home, in the workplace, and in other environments where electronic devices are operating. For example, the healthcare environment is one such environment that is particularly plagued by the effects of EMI. Part of the reason for this is that healthcare facilities are typically environments rich with medical and other devices susceptible to adverse effects of EMI. Unfortunately, because devices in healthcare facilities are, in most cases, dedicated to lifesaving and other health-related purposes, interference with these devices can have a devastating impact on the quality of a person's life or even result in the unnecessary loss of life in some circumstances.

Over the years, many incidents of suspected electromagnetic interference (EMI) with medical devices have been documented and there are several reported instances of physical harm or death as a result of EMI. Here are just a few. In one instance a pacemaker patient reportedly lost consciousness when standing for approximately 2 minutes near a security system tower emanating electromagnetic energy. In a similar incident, a pacemaker patient's pulse dropped from 70 down to 31 beats per minute while being interrogated with a metal detector in an airport. In four separate incident reports, patient ICDs (Implantable Cardioverter-Defibrillator that is implanted under the skin of patients that are at risk of sudden death due to ventricular fibrillation) were reprogrammed into the inactive mode after the patient passed through, or was hand-scanned by, a metal detector. In a similar event, an overinfusion of drugs was reported in a patient as a result of electromagnetic interference with the patient's medicament infusion device and dialysis was required to remove the excess drugs. In another incident, a patient with an implanted spinal cord stimulator patient reportedly experienced a strong shock, followed by subsequent sporadic shocks that resulted in loss of consciousness and hospitalization as a result of EMI.

In the healthcare and other environments, the environment has become crowded with potential sources of EMI, from transmitting devices such as cell phones, emergency transponders, and security systems, to the seemingly more mundane such as vacuum cleaners and other electronic devices. Indeed, extensive laboratory testing by the Center for Devices and Radiological Health (CDRH), part of the Food and Drug Administration (FDA), has confirmed that many devices are susceptible to problems caused by EMI.

As our society continues to develop and embrace new technology, there is a proliferation of potentially interfering devices such as, cellular telephones and wireless networks, just to name a few. Similarly, advancements in technology have also found their way into various medical devices, making them more susceptible in some cases to EMI. Microprocessors and sensitive electronic circuits can be found across the vast range of medical devices from monitoring and diagnostic equipment to life support equipment. In fact, modern hospitals and other healthcare facilities are replete with sensitive electronic equipment for supporting just about every aspect of modern day healthcare.

The proliferation of potentially interfering devices coupled with the proliferation of new technology in medical devices has only served to compound the problem. Unfortunately, the EMI is a complex problem and can be difficult to identify and address. Additionally, effective solutions are often cost prohibitive or impractical to implement. As with other electromagnetic fields, the strength of the electromagnetic field responsible for EMI at a given distance from its source is directly proportional to the radiated power of the transmitter and inversely proportional to the distance. Therefore, depending on the source of the interference, the consequences of EMI with medical devices may as minor as a transient "blip" on a monitor, or as serious as causing malfunction of a critical device leading to death or serious injury.

With the increasing use of sensitive electronics in devices, and the proliferation of sources of EM energy, there is heightened concern about EMI in many devices. While the numbers of reports with possible links to EMI have been steady, these numbers are believed by many to not accurately reflect the increasing occurrence of EMI-related incidents. Indeed, in investigating possible EMI-related problems it is often the case that the EM energy responsible for the event has been shut off or removed from the area.

In many reported EMI cases, the effects appear to result in immediate patient symptoms such as a change in heart rate or overstimulation to nerve tissue. However, in some cases a patient might not immediately associate the adverse interaction with the exposure, yet the possibility of suffering serious consequences remains (as in the cases of drug overinfusion or reversion of an ICD to monitor mode mentioned above). Additionally, with EMI, patients may experience some device interaction while they are within the interfering field, but the noticeable effects of the EMI may quickly diminish once the patient has exited the system.

Thus, for these and other reasons, the variable and complex nature of EMI disruptions make them difficult to address in a variety of environments, including healthcare facilities, construction sites, airplanes, FAA control towers, power plants, manufacturing facilities, homes and offices, and others. However, depending on the environment in which EMI is a factor, the impacts could range from unnoticeable or minimal to merely inconvenient, to life-threatening or devastating. An approach to addressing EMI in a plurality of environments is warranted.

BRIEF SUMMARY OF THE INVENTION

According to one embodiment of the invention a method for limiting the effect of EMI on an electronic device, is provided wherein the method includes steps of monitoring a location of an electronic device within an environment; determining a level of electromagnetic radiation in a location of interest within the environment; and implementing corrective action to limit the effect of the electromagnetic radiation on the electronic device. According to this method, in one embodiment the location of interest comprises at least one of a current location of the device within the environment; a future location of the device; and a location that is proximal to the current location of the device. The step of determining the amount of electromagnetic radiation at a location of interest can comprise at least one of the steps of estimating a level of electromagnetic radiation at the location of interest based on equipment stationed at that location; estimating a level of electromagnetic radiation at the location of interest based on a scheduled use of equipment stationed at that location; and receiving a signal from at least one receiver or other detector positioned at the location of interest, the signal indicating a level of electromagnetic radiation in the location of interest.

In one embodiment, the corrective action comprises at least one of alerting a user of the electronic device of the danger; directing the user to a safe location or other location having a lower level of electromagnetic radiation; generating an alert regarding the level of electromagnetic radiation at that location; altering the operating characteristics of the electronic device; altering the operating characteristics of one or more other devices at that location; instructing a user of at least one other electronic device; and suspending operation of at least one other electronic device at that location.

According to another embodiment, the invention is directed toward an EMI management system, comprising first control logic configured to monitor a location of an electronic device within an environment; second control logic configured to determine a level of electromagnetic radiation in a location of interest within the environment; and third control logic configured to implement corrective action to limit the effect of the electromagnetic radiation on the electronic device. The EMI management system can further include one or more data repositories configured to store location data, device data and subject data. In these embodiments, the location data comprises at least one of levels of electromagnetic radiation at a location of interest, devices stationed at a location of interest, an operating schedule of devices located at a location of interest, an identification of an EMI hot spot location, and an identification of an EMI safe zone; the device data comprises at least one of a device identification, a level of electromagnetic energy radiated by the device, operating frequencies of the device, an electromagnetic signature of the device, device capabilities and a level of criticality of the device; and the subject data comprises information pertaining to device sensitivity to electromagnetic radiation, side effects of a level of electromagnetic radiation, and capabilities of a device to correct for levels of electromagnetic radiation.

In one embodiment of the invention, the control logic is configured to cause an offending device to change its operating characteristics; be shut down, be disabled, and be rescheduled for operation at a different time. In yet another embodiment, the control logic is configured to generate an alert, wherein the alert comprises at least one of: a message to personnel to power down, disable or change the operating characteristics of an offending device; a message to personnel to intercept the device user; a message to the device user that they are in or nearing an area of higher-than desired levels of electromagnetic radiation. The alerts can comprise an audible, visual, tactile and other sensorial alert.

Further features and advantages of the present invention, as well as the structure and operation of various embodiments of the present invention, are described in detail below with reference to the accompanying drawings.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

DETAILED DESCRIPTION OF THE INVENTION

The present invention is directed toward a system and method for monitoring and managing electromagnetic radiation and its effects on various equipment and devices. In accordance with one embodiment of the invention, an EMI management system monitors the location of a subject electronic device to determine whether that device is in or near an EMI hot spot (for example, an area where EMI levels are near or meet or exceed a threshold EMI level for the given device). In another embodiment, the EMI management system can be implemented so as to monitor one or more locations of interest in an environment to determine levels of electromagnetic radiation in those locations. In yet another embodiment, the EMI management system can be implemented so as to detect unwanted or unauthorized emanations of electromagnetic radiation in a given location. The EMI management system can also be implemented so as to generate alerts and to take corrective action where warranted based on levels of electromagnetic radiation in one or more areas of interest.

Figure 1:
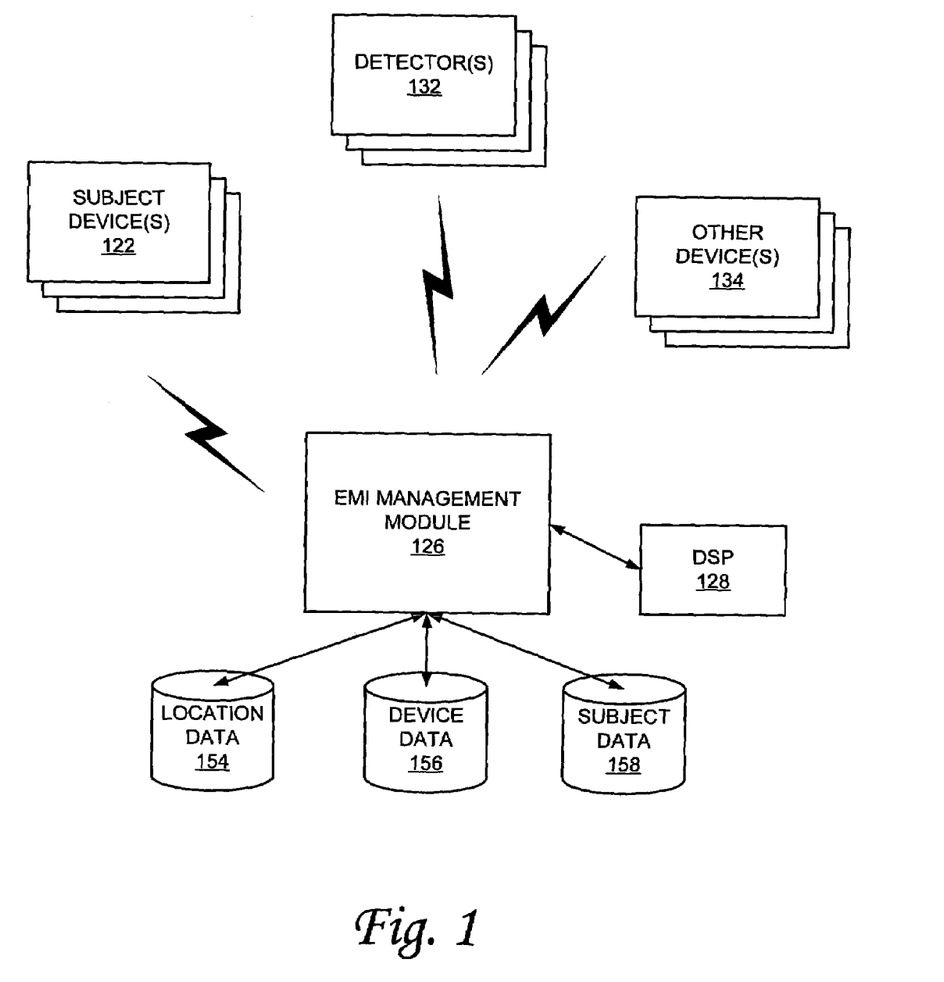
FIG. 1 is a functional block diagram illustrating an example architecture of an EMI management system in accordance with one embodiment of the invention.

FIG. 1 is a functional block diagram illustrating an example architecture of an EMI management system in accordance with one embodiment of the invention. After reading this description, it will become apparent to one of ordinary skill in the art how to implement some or all of the described functionality using alternative physical, functional or logical architectures. Referring now to FIG. 1, the illustrated embodiment of the EMI management system includes an EMI management module 126 along with a plurality of data repositories 154, 156, and 158. Also associated with EMI management module 126 in the illustrated embodiment is a digital signal processor 128. EMI management module 126 is communicatively coupled to one or more subject devices 122, one or more detectors 132, and one or more other electronic devices 134. In one embodiment, EMI management module 126 can be implemented as processor-based system configured to execute a set of instructions to perform the described functionality. As will be apparent to one of ordinary skill in the art after reading this description, in alternative embodiments, EMI management module 126 can be implemented utilizing other configurations as well. For example, in one embodiment its functionality can be implemented as machine-readable instructions capable of being executed by a processor and stored on a computer-accessible medium. EMI management module 126 can be described as being comprised of control logic configured to implement the desired functionality, and the control logic can be implemented using hardware, software, firmware or any combination thereof.

In the illustrated embodiment, subject devices 122 are devices that are susceptible to or otherwise potentially impacted by the effects of electromagnetic interference, or EMI. For example, in a health care environment, subject devices may include pacemakers, infusion pumps, Implantable Cardioverter-Defibrillators (ICDs), nerve stimulators, monitoring devices, pagers and communicators, and other electrical or electronic devices and equipment that may be used in the diagnosis, care, and treatment of patients in a health care facility. As another example, in an aircraft or FAA control tower, subject devices may include, for example, communication and navigation equipment, control equipment, measuring and monitoring devices, safety systems, and other electrical or electronic devices that may be sensitive to or otherwise adversely impacted by the effects of EMI. These examples serve to illustrate a few different types of equipment or devices 122 that may be monitored for the effects of EMI in accordance with one embodiment of the invention in these environments. After reading this description, it will become apparent to one of ordinary skill in the art how to implement the invention to monitor the effects of EMI in other equipment and devices in alternative environments.

In one embodiment of the invention, in operation the one or more subject devices 122 are in communicative contact with EMI management module 126. For example, in the illustrated embodiment, a subject device 122 can send status and other information to EMI management module 126 to enable EMI management module 126 to assist in monitoring the health or status of subject device 122. For example, this status information can include information such as the strength of an electromagnetic radiation field or fields in the proximity of subject device 122, the location of subject device 122, a signal-to-noise ratio as determined by subject device 122 (for example, where subject device 122 includes a receiver or other detector capable of detecting electromagnetic signals), and other performance or status information of subject device 122. In addition, implementations of the invention are not limited to monitoring or controlling the effects of EMI, but can also be used to monitor other health and status information of the one or more subject devices 122 such as, for example, battery power, device performance, device utilization, maintenance schedules, and other such health and status information.

The communication link between subject devices 122 and EMI management module 126 can be implemented utilizing wired or wireless communication channels as may be desired or appropriate for the given application. For example, where the subject device 122 is a pacemaker, portable insulin pump, ICD, or other portable electronic device designed for ease of mobility, the communication link between that device 122 and an EMI management module 126 is preferably implemented using a wireless communication link. Of course, as this wireless communication link may also be susceptible to adverse effects of EMI, where practical, it may be preferred to implement the communication link utilizing a wired communication channel or otherwise ensuring that the communication link has adequate immunity from EMI effects. The communication link between the a given subject device 122 and EMI management module 126 can be implemented as a full-duplex communication link allowing communications not only from the subject device 122 to the EMI management module 126, but also allowing communications from EMI management module 126 to one or more subject devices 122. Thus, for example, EMI management module 126 can send appropriate alerts, messages, or other status information to the one or more subject devices 122 being monitored. More detailed information about the alerts, messages, and other status information that can be provided from an EMI management module 126 to a subject device 122 is provided below.

As noted above, EMI management module 126 can be implemented so as to have access to a plurality of data repositories, which are illustrated in the example of FIG. 1 as location data 154, device data 156, and subject data 158. These repositories can be implemented utilizing any of a variety of data storage devices including, for example, disk or tape drives, hard drives, electronic memory devices and so on. Location data 154 can include data such as information about one or more locations in which a subject device 122 may be positioned or located. To better illustrate this embodiment, consider an example where the environment in which the invention is implemented is a health care facility. Further consider in this example that the subject device 122 is a portable medication infusion pump that is capable of moving with a patient throughout various locations within the health care facility.

Thus, in terms of this example, in one embodiment location data 154 can include information regarding the levels of EMI in one or more locations in the health care facility. Information pertaining to the levels of EMI can be determined in a number of different ways depending on the equipment utilized in the implementation of the invention. For example, one or more detectors 132 can be positioned in various locations in the health care facility to detect, in real time or near real time, then current levels of electromagnetic radiation existing in their respective locations. One or more detectors 132 can also or alternatively be provided with subject device 122 (either internally or externally) to detect, in real time or near real time, then current levels of electromagnetic radiation in the proximity of subject device 122. This information can be reported back to EMI management module 126. This can allow EMI management module 126 to monitor the health care facility (or other environment) for EMI hot spots or to maintain current information about levels of electromagnetic radiation in various locations.

In another embodiment, information about the levels of electromagnetic radiation in a particular location can be determined or predicted based on information regarding the number and types of equipment in a particular area, scheduled equipment utilization in a particular location, and other like information. Thus, for example, in this embodiment, EMI management module 126 may use this information to calculate projected levels of electromagnetic radiation in the various locations.

Additionally, certain locations within the health care facility can be flagged as EMI hot spots or otherwise flagged as typically being areas of intense concentrations of electromagnetic radiation. Areas with different levels of electromagnetic radiation may be grouped into different categories based on their levels of electromagnetic radiation. For example, the information technology (IT) computing center, a hospital's radio communication center, an X-Ray facility, or other device intensive areas may be flagged in the database as being EMI hot spots that should be avoided by devices 122 of certain sensitivities. As another example, other areas such as treatment rooms may have moderate levels of electromagnetic radiation and thus be classified accordingly. As yet a final example, areas with relatively few sources of electromagnetic radiation such as lobbies, the gift shop, the chapel, and certain patient wings may be classified as very low-level areas.

Therefore, threshold information can be included to allow the EMI management module 126 to ascertain whether certain devices 122 of lesser sensitivity may enter areas that may be otherwise unsuitable for devices 122 of a greater sensitivity level. Thus, location data 154 can include information pertaining not only to whether electromagnetic radiation is present in a particular location or whether a particular location is an EMI hot spot, but also information regarding the level or amount of EMI that may be found in a particular area. In this manner, EMI management module 126 can use this information to determine whether the electromagnetic radiation in a particular location is approaching or exceeding the recommended thresholds for a particular device 122.

In addition to identifying EMI hot spots or other EMI danger zones, location data 154 can also identify one or more safe locations within the given environment. Thus, for example, there may be one or more locations within a given environment that are relatively free of electromagnetic radiation and these areas can be identified and the identification information stored as location data 154. Thus, for example, continuing with the above example of the medication infusion pump in a health care environment, if during his or her travels, the patient encounters an EMI hot spot that could potentially interfere with the proper operation of the infusion pump, the patient may be directed to a safe zone or other clear area nearby his or her current location to allow an expeditious removal of the patient and his or her infusion pump from the potentially dangerous area.

Additionally locations can be classified based on a type or frequency of electromagnetic radiation in addition to or instead of based on electromagnetic radiation levels. For example, electromagnetic radiation emanating from a security system may be different from the electromagnetic radiation emanating from an X-Ray machine or from an MRI system. Different subject devices 122 may have different sensitivities to these various different types of electromagnetic radiation. Thus, in one embodiment, it is useful to categorize locations based on the type or character of electromagnetic radiation that may be generated (and thus, the impact it may have on various different devices 122).

As mentioned to above, in one embodiment determinations as to levels of electromagnetic radiation that may be found in a particular location can be made by performing predictions based on the equipment that is stationed in a particular location. Thus, in this embodiment, location data 154 may also include identification of equipment (for example, other devices 134) that may be stationed in a particular location, along with a schedule of usage dates and times for that equipment and perhaps the type of use for that equipment. Thus, with this equipment and schedule information, EMI management module 126 can calculate projected levels of EMI in a given location at a given time based on the scheduled use of equipment in that location.

In one embodiment, EMI management module 126 can use this scheduling information to generate reports indicating the various levels of electromagnetic radiation that may be projected for the various locations within the given environment. Thus, continuing with the example of the health care facility, in this embodiment, EMI management module 126 can generate a schedule projecting the various levels of electromagnetic radiation that may be found at the various locations within the health care facility in the future. This report can include projected EMI levels for locations such as various operating rooms, treatment rooms, MRI locations and so on, based on scheduled usage of equipment. Additionally, reports can be generated to show historic EMI levels for the various locations as well.

Thus, for example, a health care professional may receive an electronic or hard-copy report indicating locations to avoid for particular devices 122 or classes of device 122. For example, in one embodiment, EMI management module 126 can generate on a daily basis, on a shift basis, or otherwise, a map of the health care facility and indications on that map of the projected levels of EMI for each location. Thus, the health care workers can plan patient moves and other activities in accordance with these projections. The projections can be updated with real time information (for example, information received from detectors 132) to allow health care workers to verify that the planned activities are still a safe course of action with respect to levels of electromagnetic radiation in particular locations. Additionally, alerts or other messages can be used to update health care workers when the scheduled utilization of equipment changes or when information from detectors 132 indicates that the real time actual conditions deviate from that which was projected for a given location in the original schedule.

Device data 156 can also be included to provide information pertaining to the one or more devices (for example, other devices 134 or classes of other devices 134) that may be deployed in one or more areas within the environment and their characteristics. Thus, in one embodiment, device data 156 can include information such as, for example, a device identification, the EMI performance of a device 134 (for example, the level of electromagnetic energy radiated by the particular device 134), operating frequencies of the device 134, an electromagnetic signature of the device, and device capabilities (for example, the device is capable of changing channels, altering operating frequencies, decreasing transmit power, spreading its transmitted communication signal, and other like information that may be utilized in minimizing the impact of EMI from that particular device). Thus, device data 156 can be used in conjunction with scheduling data, as described above, to generate projections or other information regarding EMI hot spots that may be found in one or more locations within the facility.

Device data 156 may also include information regarding the criticality of a particular device 134 or class of device 134. The criticality of the given device may be based on the nature or class of device regardless of its utilization, or, alternatively, the criticality of a device may vary based on the use or type of use of a given device 134 at a given time. Thus, in one embodiment, information regarding the criticality of a device can be used by EMI management module 126 to determine whether an offending device (i.e., a device generating a level of electromagnetic radiation that may result in EMI that is harmful to another device 122) can be shut down or temporarily disabled until the subject device 122 is out of harm's way. Thus, in one embodiment, EMI management module 126 can be utilized to make decisions to power down or otherwise temporarily disable one or more offending devices 134 such as, for example, where they may cause a life-threatening interference with a subject device 122. Alternatively, rather than EMI management module 126 making decisions whether to shut down one or more offending devices 134, EMI management module 126 can generate an alert 142 to the appropriate personnel, allowing the appropriate personnel to make a decision whether to power down or otherwise disable an offending device 134 or to take other appropriate action. Alerts of various forms are discussed in further detail below.

Subject data 158 is also included in the illustrated embodiment and can provide information about the one or more subject devices 122 that may be monitored by the present invention. Subject data 158 can include, for example, information about a subject device 122 or a class of subject devices 122 such as, for example, device sensitivity to electromagnetic radiation, side effects that may be caused by certain levels of EMI, and the capabilities of the device to correct for certain levels of electromagnetic radiation (for example, changing channels, changing operating frequencies, or other actions that may be used to minimize the impact of EMI on the particular device 122).

In the example illustrated in FIG. 1, a digital signal processor (DSP) 128 is also included with an EMI management module 126 to allow processing of one or more signals that may be received by an EMI management module 126 from various devices within the environment. Thus, for example, in one embodiment, a DSP 128 (or other functionality) can be utilized to analyze an offending electromagnetic radiation signal and identify the device 134 responsible for that signal within the environment. For example, the electromagnetic signals generated by a device 134 within the environment may have a particular signature that is unique to that device or unique to a particular class or type of devices. Thus, a DSP 128 or other functionality can be used to identify an offending device based on the signature of the offending electromagnetic signal. Thus, in one embodiment, if in operation, EMI management module 126 receives information from a detector 132 that the levels of electromagnetic radiation in a particular location are higher than anticipated, the offending device responsible for the unwanted level of electromagnetic radiation can be identified via its electromagnetic signature.

In another embodiment, EMI management module 126 may determine that levels of electromagnetic radiation in a particular location are higher than anticipated, and that these levels are caused by electromagnetic radiation due to the presence of an unauthorized or unexpected device 134 in that location. For example, a spectrum analyzer or DSP or other functionality may detect the presence of a relatively strong signal centered at 1.9 GHz, such as that which would be transmitted by a PCS cellular telephone. EMI management module 126 may also determine that a cellular telephone is listed in the database as equipment designated to that location (or that cellular phones are not authorized at all for that location). As such, EMI management module 126 can attribute the unexpected presence of electromagnetic radiation to the unanticipated presence of a cellular telephone. Additionally, EMI management module 126 can take appropriate steps to remediate the EMI caused by the electromagnetic radiation emanating from the cellular telephone as discussed below.

As mentioned above, one or more detectors 132 can be included in various locations in the environment to allow real time or near real time monitoring of electromagnetic interference at a given location. A detector 132 may also include a spectrum analyzer such that more information about electromagnetic signals in a given location can be determined. This information can be provided to EMI management module 126 via a hard wired or wireless communication link, allowing EMI management module 126 to use this real time or near real time data in assessing the EMI risk to one or more subject devices 122. Additionally, EMI management module 126 can utilize this information to compare actual electromagnetic radiation data to projected electromagnetic radiation predictions, and can log this data for report generation, historical analysis, and trend prediction.

Other devices 134 can also be communicatively coupled to EMI management module 126 via a wired or wireless communication link. As indicated above, other devices 134 are devices within the environment that may give rise to electromagnetic radiation that could potentially interfere with the one or more subject devices 122 operating within the environment. As subject devices 122 are also typically electronic devices, a given subject device 122 may also potentially interfere with another subject device 122. As such, a given subject device 122 may also be classified as an "other device" 134, and vice versa. Other devices 134 can provide information to EMI management module 126 such as, for example, information pertaining to whether the device is operational (e.g., on or off), a mode of operation, a currently assigned channel or operating frequency, transmitter power, or other information about the particular device 134. Thus, EMI management module 126 can utilize this real time or near real time information about the other device 134 in identifying EMI hot spots, updating device data 156 and location data 154, and otherwise monitoring the state of electromagnetic radiation in the given environment.

EMI management module 126 can also generate one or more alerts 142 to other devices or to appropriate personnel within the environment. EMI management module 126 can also generate alerts directly to one or more subject devices 122 and one or more other devices 134. With respect to alerts 142, these alerts can be generated as audible alerts, visual alerts, tactile alerts or other sensorial alerts. In one embodiment, an alert 142 is generated as an audible alert that can be heard by one or more personnel within the given environment. Thus, for example, if a patient with a sensitive device 122 travels into or is nearing an EMI hot spot, an alert may be generated and played over a speaker in a location that is within hearing range of the patient, warning the patient about the electromagnetic radiation. For example, if a patient is nearing a computing facility in the environment that has higher levels of EMI than the patient's device 122 can tolerate, a warning may be generated on a speaker alerting the patient not to proceed any further or not to enter the hazardous environment. Audible alerts 142 can also direct the patient to a safe zone to allow him or her to remove him/herself from harm's way. In one embodiment, the speaker can be positioned in a room, hallway or other location within the environment. In another embodiment, the speaker can be integrated with the subject device 122.

As another example, an offending device 134 may be a metal detector at a security station used at the entrance of the facility. When a subject device 122 nears that location, an audible alert may be generated by the speaker warning the appropriate personnel not to allow the subject device 122 to approach or to pass through the metal detectors. Alerts can also be sent to computer monitors, control panels, printers, or other devices allowing the appropriate personnel to receive the alert and respond accordingly. The alerted personnel may decide to suspend pro tempore the operation of the metal detectors until the patient can be located and safely removed from the area.

In addition to generating alerts 142 to appropriate personnel or other devices, alerts can be sent directly to a subject device 122 or an offending device 134. Thus, for example, if it is determined via a position determination mechanism that a subject device 122 is nearing an area of higher than advised levels of electromagnetic radiation, an alert can be sent to the device 122 or to the location to inform the user that they are approaching a potentially troublesome area. The alert can be an audible, visual, tactile or other sensorial alert sufficient to inform the user of the potential harm. Thus, for example, voice alerts can warn the user not to proceed to a particular location, or to return from where they came. As additional examples, beeping tones of increasing frequency or pitch can be used to identify increasing areas of EMI hot spots as the user transports device 122 from one location to another. Textual or graphical displays can provide more detailed information about the danger and how to avoid it. Additionally, where appropriate, in one embodiment control information may be sent from an EMI management module 126 to the subject device 122 directing the subject device 122 to change its operating characteristics where possible (for example, to change channels or operating frequency) to lessen the impact of the given electromagnetic radiation on the subject device 122. In yet another embodiment, control information may be sent from an EMI management module 126 to one or more offending devices 134 in that location directing the offending device 134 to change its operating characteristics where possible (for example, to change channels or operating frequency) or temporarily shut down or pause operations to lessen the impact of the given electromagnetic radiation on the subject device 122.

Figure 2:
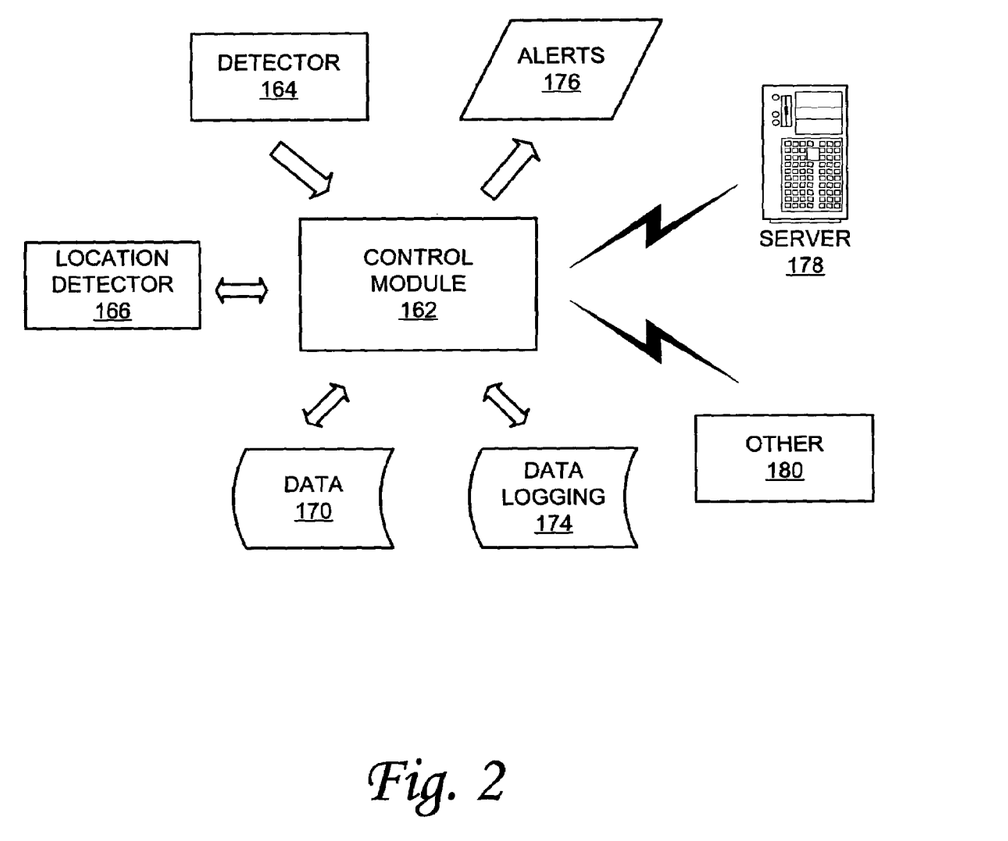
FIG. 2 is a functional block diagram illustrating an example implementation of a subject device 122 in accordance with one embodiment of the invention.

The exemplary embodiment illustrated in FIG. 1 is a server-centric embodiment wherein much of the functionality is allocated to a central EMI management module 126. As stated above, however, this depiction is not intended to limit the application of the desired functionality to this particular architecture and, indeed, one or more elements of desired functionality can be distributed to other components or devices within the environment. For example, in an alternative embodiment, some or all of the described functionality can be placed within a subject device 122. FIG. 2 is a functional block diagram illustrating an example implementation of a subject device 122 in accordance with one embodiment of the invention. Referring now to FIG. 2, subject device 122 includes control module 162, which can be implemented with any of a variety of forms of control logic utilizing hardware, software, firmware, or a combination thereof. For example, in one embodiment, control module 162 is implemented as a processor-based system, while in other embodiments control module 162 can be implemented using ASICs, PLAs, or other logic components. In yet another embodiment, the functions of control module 162 can be implemented as machine-readable instructions capable of being executed by a processor and stored on a computer-accessible medium.

In the embodiment illustrated in FIG. 2, subject device 122 also includes a location detector 166, a signal detector 164, an alert mechanism 176, a local data repository 170, a data logging capability 174, and communication links to a server 178 (for example, a server on which an EMI management module 126 may be configured) and other devices 180 (for example, other devices 134, or other external devices for reporting and monitoring purposes, and so on).

Location detector 166 can be included to allow position determination to be determined locally by the subject device 122. Thus, in this embodiment, subject device 122 can use location detector 166 to determine its own location within a given environment, and utilize this information locally to determine the risk from potentially harmful EMI. Additionally, locally determined position information can be provided to EMI management module 126 or other devices 180 via a wired or wireless communication link to those devices. Location detection can be implemented using any of a variety of techniques including, for example, utilizing a global positioning system (GPS) receiver or other triangulation techniques.

Alternatively, triangulation techniques can be implemented using the RFID tag or other wireless communication device that may be provided in conjunction with subject device 122 and be in communicative contact with a plurality of transponders or other communication devices in proximity thereto. In one example implementation, subject device 122 can operate as a transmitter, transmitting its information (for example, its identification and a timing code) to the plurality of transponders or other communication devices for triangulation. In another embodiment, subject device 122 can operate as a receiver, receiving information from the plurality of transponders or other communication devices to facilitate triangulation. Hybrid solutions can also be implemented combining receive and transmit capabilities to facilitate triangulation with a plurality of transponders or other communication devices. Triangulation can be performed based on timing (relative or absolute), signal angle(s), signal strength, and other information.

In another embodiment, position determination can be made based on simple measurements such as, for example, proximity determination. This can be done by transmitting or receiving (or both) information between the subject device 122 and an external communication device with which it is in contact. For example, in one embodiment, a communication device can be provided with subject device 122 to receive signals from a nearby transmitter. For example, transmitters may be positioned at various locations within the environment and may transmit identification or other information that can be used to identify that transmitter's location within the environment. Thus, the signals received by the subject device 122 can include information identifying the transmitter (from which identification location information can be derived) or identifying a location in which the transponder or communication device is located. Thus, in this manner, a certain level of position determination can be accomplished without resorting to the more complex GPS or other triangulation techniques. For example, the location of subject device 122 can at least be determined as being in the proximity of the transmitter/receiver with which the subject device 122 is in communicative contact (either reception or transmission or both).

Similarly, the subject device may include transmit capabilities to transmit its identification or other information to one or more receivers located at known location(s) within the environment. Whether receive-based, transmit-based or a combination thereof, signal strength measurements or other information may be used to further refine the location information. For example, received signal strength may be used to indicate a distance between a receiver and transmitter, as may a timing code (relative or absolute). Additionally, phased-array, smart antenna or other directional antenna configurations can be utilized to determine an angular position of a device within the communicative sphere of another device. The combined distance and angle estimates may further assist in refining the position estimation.

Numerous wireless technologies can be used to implement the above functionality including conventional wireless receivers/transmitters now or later developed. Additionally, cost-effective solutions such as, for example, RFID tags and RFID readers, can also be used to facilitate detection of an RFID (for example on a device 122) in proximity to an RFID reader, or vice versa.

As a more specific example of the above, in one embodiment, location detector 166 may be implemented without having any receiver capabilities for position determination in and of itself. For example, location detection can be accomplished by an RFID tag reader or other transponder at a given monitoring location which senses the presence of the subject device 122 and reports this information back to an EMI management module 126 or other location. For example, as a patient is wheeled from a patient room to a treatment room, RFID readers at various points along the route (e.g., in hallways, elevators, nurses' stations, rooms, at doorways, and so on) sense the presence of the patient's RFID tag (or the device's tag), which might include an identification of the patient (or of the device). This identification information can be used to identify a location of the patient and his or her device 122 at the time of reception, the location based on the point of reception, and also to determine appropriate safe levels of EMI for the patient's device(s) 122. Thus, in this relatively straightforward embodiment, location detector 166 can be implemented as nothing more than an RFID tag (or like technology) identifying the patient or the subject device 122 (or class of device 122) to an RFID reader at a given location.

In the embodiment illustrated in FIG. 2, subject device 122 also includes a signal detector 164. A signal detector can be used to detect the presence and level of electromagnetic radiation that may give rise to EMI in the area of subject device 122. Thus, in embodiments including a signal detector 164, a subject device 122 can be implemented so as to make its own determination as to the levels of EMI in a given location without the need to rely on information from an EMI management module 126. Signal detectors can be implemented to include signal strength monitors as well as spectrum analysis. Additionally, analysis capabilities can be included to identify a particular device 134 or class of devices as the offending device based on the signature of the offending electromagnetic radiation.

Data 170 can include data such as, for example, the data described above in data repositories 154, 156, and 158. Thus, with its own signal detection, position determination, and data repositories, subject device 122 can be implemented so as to perform the functionality described above with reference to FIG. 1 in a standalone or quasi-standalone manner. Additionally, subject device 122 can record events, statuses and other information in data logging 174 for historical, reporting and analysis purposes.

One or more alerts 176 can be generated to the user of subject device 122 to warn the user of EMI dangers either impending or encountered. The alerts can be audible, visual, tactile, or other sensorial alerts sufficient to warn the user of the danger such as those described above. The alerts can be generated locally, or a signal sent to a server such as an EMI management module 126, such that EMI management module 126 can generate alerts 142 such as those described above with reference to FIG. 1.

Although not illustrated, in one embodiment, sufficient functionality is included with subject device 122 such that a link to EMI management module 126 is not necessary for operation of the device in accordance with its goals and objectives.

Having thus described exemplary architectures for an EMI management system, operational embodiments of the invention are now described in terms of a particular example environment. Description of operational aspects of the invention in terms of a particular example environment is done for ease of discussion and clarity of description. After reading this description, it will become apparent to one of ordinary skill in the art how to implement the invention in one or more various alternative environments or applications.

More particularly, the example environment used for discussion purposes is that of a hospital or other health care facility that may include a plurality of different locations within the environment. These different locations may present differing levels of EMI risk to one or more subject devices 122, and these differing levels of EMI risk may vary temporally. For example, the health care environment may include locations with the presence of relatively low electromagnetic radiation strength such as lobbies, a gift shop, a chapel and a cafeteria. The health care facility may also include areas with the presence of moderate electromagnetic radiation such as patient wings, treatment rooms, and the pharmacy. Additionally, the environment may have locations of moderately high presence of electromagnetic radiation such as, for example a surgical theater with large quantities of electronic equipment, and a communication facility. Finally, the environment may have locations of high levels of EMI, such as the IT computing center, an ICU, an X-Ray room and an MRI center. Patients, doctors, nurses, orderlies, other health care practitioners, security guards, custodians, delivery personnel, and other personnel may travel throughout the facility with one or more electronic devices, which at times may be subject devices 122 for purposes of determining their sensitivity to EMI or other devices 134 as potential sources of EMI to other devices 122.

Figure 3:
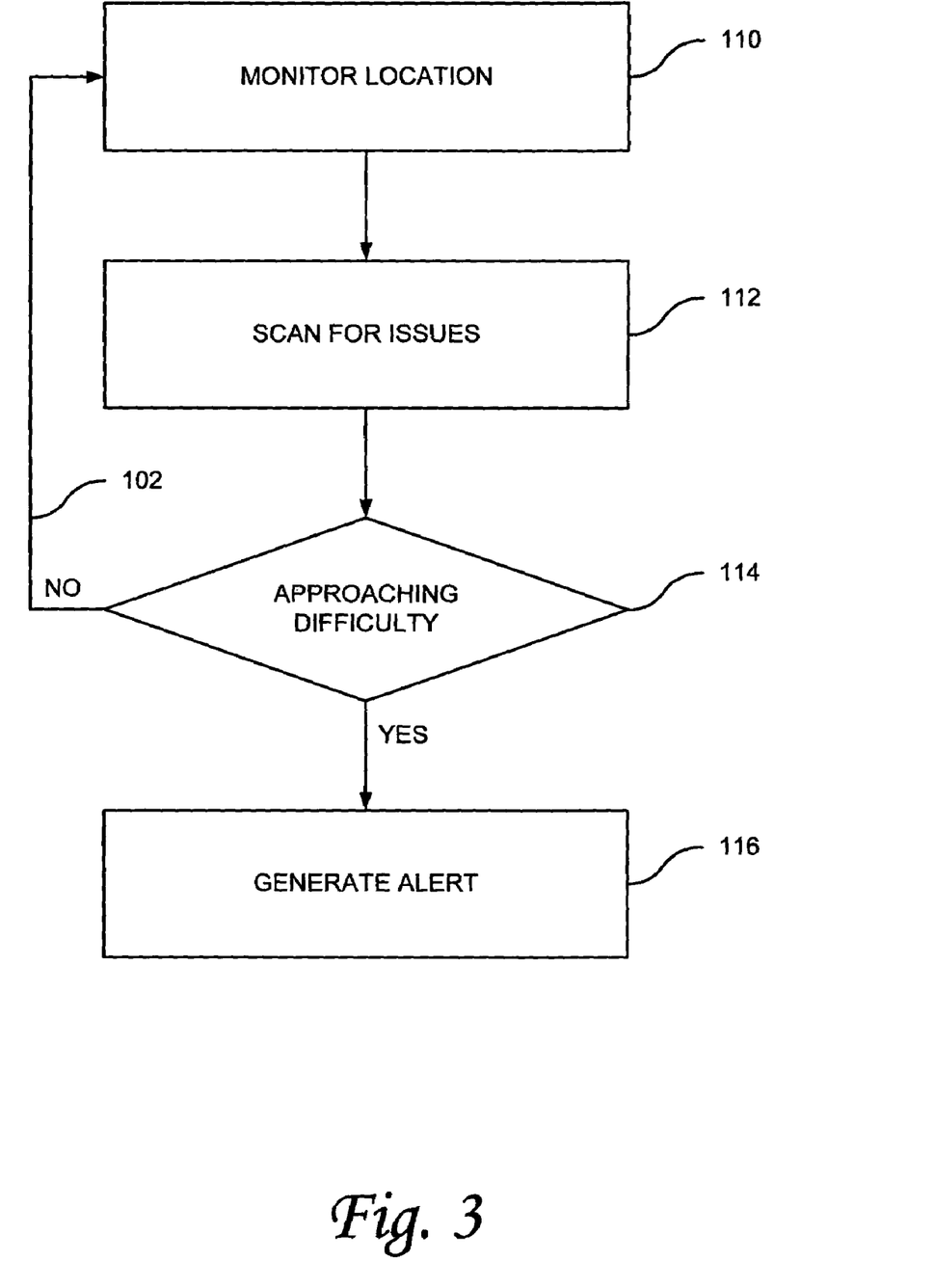
FIG. 3 is an operational flow diagram illustrating an example operation of the EMI management system in accordance with one embodiment of the invention.

FIG. 3 is an operational flow diagram illustrating an example operation of the EMI management system in accordance with one embodiment of the invention. Referring now to FIG. 3, in a step 110, the location of a subject device 122 is monitored. In terms of the example environment, the location of a patient with a device 122 such as a medication infusion pump within the health care facility is monitored. This location monitoring can be performed, for example, utilizing location detection as described above and illustrated with reference to FIG. 2, or via alternative location detection techniques.

In a step 112, as the patient travels throughout the health care facility with the medication infusion pump, the system checks for conditions that may give rise to problems with the subject device associated with EMI. For example, in one embodiment, the system checks the databases for records indicating EMI hot spots or other locations within the health care facility that should be avoided by the particular device 122. Additionally, in one embodiment, the system can check current levels of electromagnetic radiation in particular locations such as, for example, via a signal detector 164 or detector 132, to determine whether the patient has entered or is approaching an area of higher than desired EMI levels. Additionally, in another embodiment, the health or status of the subject device 122 can be checked to determine whether the device is operating properly or not. For example, the status may indicate that the device is malfunctioning in a manner that is typically attributed to electromagnetic interference. Additionally, other device operations can be monitored such as, for example, battery life, adherence to a defined medication infusion schedule, signal strength and SNR (signal-to-noise ratio) of the communication link of the subject device, and other health or status information.

If, in this monitoring process, no difficulties are identified, the monitoring operation continues as illustrated by step 114 and flowpath 102. If, on the other hand, in a step 114 an EMI hot spot or other potential difficulty is identified, an appropriate alert is generated in a step 116. To illustrate this, consider an example in the health care environment where the patient with the medication infusion pump is nearing a security station having metal detectors. Further consider that metal detectors of the type used in the subject security monitoring station are known to interfere with the type of infusion pump used by the patient. In this case, appropriate action can be taken to remediate the potential problem that may be caused if the patient wanders too close to the offending metal detectors.

In accordance with this example, in a step 116 any of plurality of alerts could be generated to help to avoid possible harm to the patient as a result of harmful EMI generated by the metal detectors. For example, an EMI management module 126 can generate an announcement over a speaker in that location alerting the user and appropriate security personnel that the user is approaching a location that could be harmful to the operation of his medication infusion pump (for example, an alert 142). Using device IDs, patient identification, or other information, the alert can be tailored to the particular patient such that the patient can be identified by name to avoid potential confusion in what is possibly a critical time. Thus, for example, the alert could specifically identify the patient by name and ask that patient not to approach the metal detectors.

In another embodiment, a visual alert such as a light (for example, LED) or display screen, an audible alert (such as a beeping or buzzing), or a tactile alert (such as vibration) can be generated to alert the patient of the impending danger. In one embodiment, the alert can increase in intensity, rate or frequency to indicate increasing danger from elevated levels of electromagnetic radiation. In embodiments where a display screen or other GUI (graphical user interface) is utilized, more specific information can be provided to the user on the display using textual information, graphics, or a combination thereof. The GUI can also be used to direct the patient away from the known danger, preferably to a known safe spot.

In yet another embodiment, alerts can be provided to the security personnel staffing the security station. These alerts can be sent via their radios, computer terminals, or other devices, alerting the security guards that a patient with a sensitive subject device 122 is nearing the potentially harmful metal detectors. In response, security personnel can take appropriate steps to redirect the patient or to disable the metal detectors and temporarily suspend screening operations until the patient can be safely removed from the area.

In still a further embodiment, a fail-safe mode can be implemented to automatically shut down the offending device (in this case, the metal detectors) in the event that the patient is not removed from the potentially dangerous area in an expeditious manner. Of course, a fail-safe shutdown such as this can be accompanied by the appropriate alerts such that security personnel can take the appropriate measures to ensure the safety and security of the facility during the shutdown while also assisting the patient to return to a safe location. Instead of shutting down the offending device, in some cases the operating characteristics of the offending device may be altered to lessen the impact of its emitted electromagnetic radiation on the subject device 122. In one embodiment, shutting down or altering the characteristics of the offending device are done automatically. In other embodiments, to ensure that mission-critical or life-critical devices are not unilaterally disabled, information may be provided to the appropriate personnel directing them to shut down or modify the offending device accordingly, if possible. In automatic environments, information may be included in one or more data repositories indicating the function or criticality of various devices 134 in the environment. Thus, in one embodiment, the EMI management system may be implemented so as to determine whether a given offending device can be shut down or its operating characteristics altered, at least temporarily. This determination can be made, for example, based on the function or criticality of the offending device, as well as on current or scheduled utilization of the device. In making such a determination, in one embodiment, these factors may be weighed against the potential harm that may come to the user of the subject device 122 as well.

As described above in reference to step 112, in addition to checking for EMI difficulties, the system can also be configured to check for appropriate health, operational, and other status information from a subject device such as, for example, battery life, adherence to schedules, and so forth. In these embodiments, if difficulty in this regard is detected, the appropriate alerts can be generated to inform the patient or other personnel to correct the identified malfunction. Thus, for example, the patient can be instructed to replace the batteries in his or her subject device. As another example, a doctor or other health care provider can be immediately informed that the subject device malfunctioned by administering an improper amount of medication to the patient. This information, along with the pertinent details, can be provided to the physician or other health care provider in real time or near real time, allowing an immediate response to what could possibly be a life-threatening situation. In this embodiment, alerts can be sent to the appropriate health care provider, for example, via pager, cell phone, alert message at a nurse's station, or other means.

Figure 4:
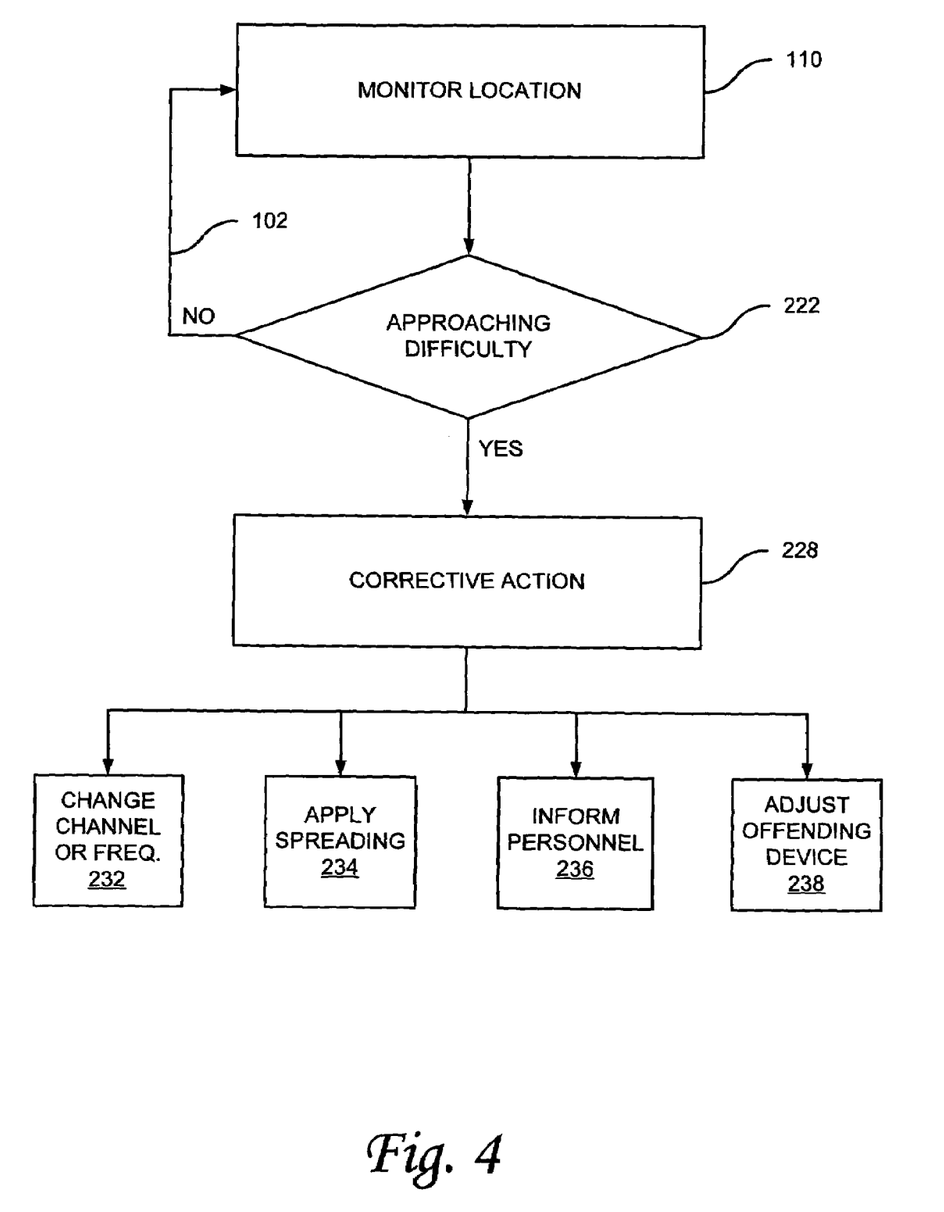
FIG. 4 is an operational flow diagram illustrating another operational aspect of the EMI management system in accordance with one embodiment of the invention.

FIG. 4 is an operational flow diagram illustrating another operational aspect of the EMI management system in accordance with one embodiment of the invention. Referring now to FIG. 4, in a step 110 the invention monitors EMI activity at a particular location. For example, an EMI management module 126 may monitor signals received by detectors 132 at one or more locations, as well as the activity of other devices 134 at those locations, to determine the electromagnetic radiation levels present at a given location. Detected electromagnetic radiation levels can be compared with acceptable levels at a given location to determine whether a potential trouble spot or EMI hot spot is forming or is encountered. For example, electromagnetic radiation levels at particular locations can be compared with projected or target electromagnetic radiation levels for those locations to determine whether the actual levels are approaching or have exceeded a designated threshold for that area.

If the electromagnetic radiation levels detected at a particular location approach or exceed a desired threshold for that location, corrective action can be taken as illustrated by steps 222 and 228. The corrective action can include steps such as changing the channel or operating frequency of offending devices 134 as illustrated by step 232, applying signal spreading as illustrated by steps 234, informing appropriate personnel as illustrated by step 236, or otherwise adjusting the offending device as illustrated by step 238. To better illustrate this aspect of the invention, consider an example situation where the location within the health care facility that is being monitored is an operating room during a critical operation. As new devices are turned on or brought into the operating room and other devices are turned off or removed from or the operating room, the levels of, and perhaps characteristics of, electromagnetic radiation present in the operating room will vary during the course of the operation. Thus, in accordance with this example, the invention can be implemented so as to monitor the electromagnetic radiation levels and characteristics at a given time within the operating room. In this example, if it is determined in step 222 that the electromagnetic radiation levels are approaching a dangerous level, the personnel assigned to the operating room can be informed of this potential situation.

As a result of this alert, the appropriate personnel can take appropriate action to shut down unnecessary equipment where possible to maintain a desired electromagnetic radiation level within the operating room. Information in the data repositories can be used by the EMI management system to suggest to personnel devices that can be removed or shut down based on the uses for those devices and the procedure being performed. Of course, appropriate safeguards are preferably provided such that health care workers can first verify the suggestion made by the EMI management system before taking action.

In yet another embodiment to remediate the effects of electromagnetic radiation, a directional antenna, a phased array, smart antenna or other like technology that can steer, direct or shape beam patterns can be used to reduce the effects of electromagnetic interference in certain environments or locations. For example, such antennas or antenna configurations can be used to direct electromagnetic signals so as to minimize emanation of electromagnetic energy in unwanted directions. The steering or beam forming characteristics can be activated upon an indication that corrective action is required (for example, in response to step 228) and as a default configuration to generally reduce the impact of unwanted emissions.

Figure 5:
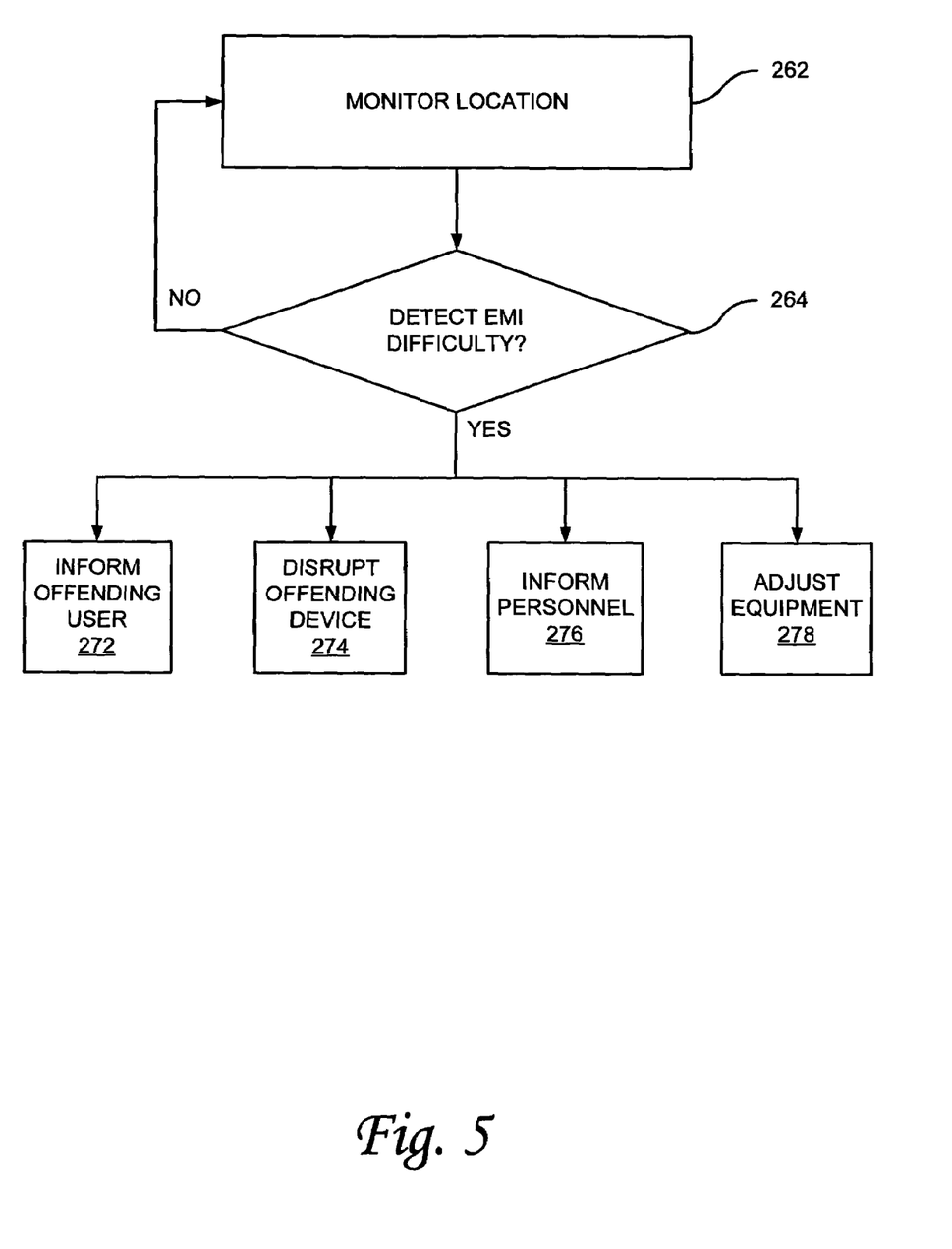
FIG. 5 is an operational flow diagram illustrating yet another operational feature of the EMI management system in accordance with one embodiment of the invention.

FIG. 5 is an operational flow diagram illustrating yet another operational feature of the EMI management system in accordance with one embodiment of the invention. With the operational feature illustrated in FIG. 5, the EMI management system can be used to detect and address the presence of an unwanted or unauthorized electromagnetic-radiation-generating device in a particular location. For example, cellular telephones and other personal communication devices and the electromagnetic radiation they generate can cause unwanted interference with navigation and communication equipment on aircrafts, sensitive electronic equipment in hospitals, and radio-controlled blasting equipment in construction sites, to name a few. Thus, in accordance with this aspect of the invention, in a step 262 the EMI management system can be implemented so as to monitor a particular location for the unwanted electromagnetic radiation, which, in this example, is a cellular telephone.

If the presence of an unauthorized communication device such as a cellular telephone is detected in a step 264, any of a number of appropriate steps can be implemented as a remedial measure. For example, in a step 272, the invention informs the offending user that cellular telephone use is not permitted in the given area. For example, an audible alert can be generated via a speaker in that location, telling the user that cellular telephone usage is not permitted in this particular location and to immediately turn off the cellular telephone. In addition, the audible information can instruct the user where to go if he or she wishes to continue use of the cellular telephone.

In a step 274, a signal can be generated to disrupt the cellular telephone's communication link, causing the cellular call signal to be dropped. Thus, for example, if the user does not follow the audible request, the system can cause the cellular signal to be disrupted, terminating the call and ending the unwanted source of electromagnetic radiation. Of course, if the user continues to redial, the system can continue to disrupt the cellular signal until the user either leaves the area or ceases attempts at making the unauthorized call.

In another embodiment, in a step 276, the invention can inform the appropriate personnel that an unauthorized cellular telephone call is being made from within the restricted location. Thus, for example, in the case of an aircraft, the EMI management system may inform a flight attendant or pilot that a passenger is attempting to make a cellular telephone call from within the cabin of the airplane at a restricted time. Thus, in response, the flight attendant can take the appropriate action to instruct the passenger to terminate the call. Returning to the example of the health care facility, appropriate hospital security personnel can be alerted to the presence of a user making an unauthorized cellular telephone call in a given location. In response, the security personnel can personally respond to the disturbance and instruct the user to either move to a location where cellular telephone calls are permitted or cease using the cellular telephone.

As discussed above, in various embodiments and implementations of the invention, RFID tags or similar technology can be utilized to provide certain of the features and functionality described herein. For example, RFID tags can be utilized to communicate information between or among one or more of the subject devices 122, other devices 134, and the EMI management system. Additionally, RFID tags can be utilized to communicate information between a device and an RFID reader or transponder at any of a given number of locations within the environment. Thus, as described above, RFID tags and readers can be utilized to facilitate the operation of locating a device, as well as to facilitate communications among devices.

Thus, in one or more embodiments, RFID tags can be implemented as read-only, read-write, passive, or active devices. Additionally, anti-collision routines, time division multiplexing and other like features can be implemented to allow communications to occur among multiple devices while reducing the occurrence of interference between those devices. In one embodiment, in addition to or in place of anti-collision routines, signal spreading can be implemented to facilitate simultaneous communication among multiple communicating devices. For example, ultra-wide band (UWB) communication techniques can be implemented to allow sharing of the electromagnetic spectrum with other communicating devices, as well as with other users and services. Any of a number of different ultra-wide band modulation schemes can be utilized including, for example, impulse radio techniques, multiplying the signal by a code word to spread the resultant signal, or multi-band OFDM (orthogonal frequency division multiplexing) techniques. However, techniques such as code division multiplexing and orthogonal frequency division multiplexing have the advantage of allowing relatively high data rates of communication to take place across the channel.

Additionally, as described above in one or more embodiments, to help remediate the adverse effects of significant levels of electromagnetic radiation emanating from one or more devices, the communications from such devices can be switched to a spread spectrum mode wherein the resultant communication signal is spread across a very wide frequency band and the signal strength is dramatically reduced. As such, spreading techniques such as this can be used to reduce the amount of interference caused by a communication device in any of a number of different environments.

While various embodiments of the present invention have been described above, it should be understood that they have been presented by way of example only, and not of limitation. Thus the breadth and scope of the present invention should not be limited by any of the above-described exemplary embodiments, but should be defined only in accordance with the following claims and their equivalents. Additionally, the invention is described above in terms of various exemplary environments, embodiments and implementations. It should be understood that the various features and functionality described in one or more of the individual embodiments, environments or implementations are not limited in their applicability to the particular environment, embodiment or implementation with which they are described, but instead can be applied, alone or in some combination, to one or more alternative environments, embodiments or implementations of the invention, whether or not such environments, embodiments or implementations are described and whether or not such features are presented as being a part of a described environment, embodiment or implementation.

Terms and phrases used in this document, and variations thereof, unless otherwise expressly stated, should be construed as open ended as opposed to limiting. As examples of the foregoing: the term "including" should be read to mean "including, without limitation" or the like; the term "example" is used to provide exemplary instances of the item in discussion, not an exhaustive or limiting list thereof; and adjectives like "conventional," "traditional," "normal," "standard," and terms of similar meaning should not be construed as limiting the item described to a given time period or to an item available as of a given time, but instead should be read to encompass conventional, traditional, normal, or standard technologies that may be available now or at any time in the future. Likewise, a group of items linked with the conjunction "and" should not be read as requiring that each and every one of those items be present in the grouping, but rather should be read as "and/or" unless expressly stated otherwise.

What is claimed is:

1. A method for managing the effect of electromagnetic interference (EMI) on an electronic device, the method comprising the steps of:
    determining at a server a location of the electronic device within an environment;
    determining at the server, levels of electromagnetic radiation in a plurality of locations of interest within the environment, wherein the step of determining the levels of electromagnetic radiation at a location of interest comprises estimating a level of electromagnetic radiation at a location of interest based on a scheduled use of equipment stationed at that location; and
    the server implementing corrective action to limit the effect of the electromagnetic radiation on the electronic device based on the location of the device and the level of electromagnetic radiation in the location of interest.

2. The method of claim 1, further comprising a step of classifying locations of interest within the environment into categories based on their respective levels of electromagnetic radiation.

3. The method of claim 1, further comprising a step of determining whether the level of electromagnetic radiation in the location of interest is approaching or exceeding a recommended threshold for the electronic device.

4. The method of claim 1, wherein the corrective action comprises directing the user to a safe location or other location having a lower level of electromagnetic radiation.

5. The method of claim 1, wherein the method steps are implemented by computer program code in a computer-readable medium configured to execute on a processor.

6. The method of claim 1, wherein the location of the electronic device is different from the locations of interest.

7. The method of claim 1, further comprising a step of the server generating a report indicating locations to be avoided by the electronic device based on the levels of electromagnetic radiation at the plurality of locations of interest.

8. The method of claim 1, further comprising a step of the server detecting unauthorized emanations of electromagnetic radiation in a location of interest.

9. The method of claim 1, further comprising a step of the server monitoring the status of the electronic device.

10. The method of claim 1, wherein determining levels of electromagnetic radiation in a plurality of locations of interest comprises measuring actual levels of electromagnetic radiation in the locations of interest.

11. The method of claim 1, further comprising a step of the server determining whether a device generating electromagnetic radiation in a location of interest can be disabled while the electronic device is in the location of interest.

12. The method of claim 1, further comprising a step of the server analyzing electromagnetic radiation patterns in a location of interest and identifying a device responsible for that electromagnetic radiation.

13. The method of claim 1, further comprising monitoring and recording historical data of the electronic device on the server, wherein the historical data includes one or more data from the group consisting of a strength of an electromagnetic radiation field in a proximity of the electronic device, the location of the electronic device, a signal-to-noise ratio of the electronic device, a battery status of the electronic device, and maintenance schedule and history of the electronic device.

14. A server based electromagnetic interference (EMI) management system, the server comprising a computer program product including a computer useable medium having computer readable program code functions embedded in the medium for causing the server to manage EMI, the computer program comprising:
    a first computer readable program code configured to determine a location of the electronic device within an environment;
    a second computer readable program code configured to determine a level of electromagnetic radiation in at least one of a plurality of locations of interest within the environment; and
    a third computer readable program code configured to implement corrective action to limit the effect of the electromagnetic radiation on the electronic device based on the location of the device and the level of electromagnetic radiation in a location of interest; and
    further comprising one or more data repositories accessible by the second computer readable program code and configured to store location data, wherein said location data comprises an operating schedule of devices located at the at least one location of interest.

15. The system of claim 14, further comprising one or more data repositories accessible by the second computer readable program code and configured to store device data and subject data.

16. The system of claim 14, further comprising one or more data repositories accessible by the second computer readable program code and configured to store device data, wherein said device data comprises an electromagnetic signature of the device.

17. The system of claim 14, wherein said third computer readable program code is configured to cause a second device to at least one of: change its operating characteristics; be shut down, be disabled, and be rescheduled for operation at a different time.

18. The system of claim 14, wherein said third computer readable program code is configured to generate an alert, wherein the alert comprises at least one of: a message to personnel to power down, disable or change the operating characteristics of an offending device; a message to personnel to intercept the device user; a message to the device user that they are in or nearing an area of higher-than desired levels of electromagnetic radiation.

19. The system of claim 14, wherein the alert comprises at least one of an audible, visual, tactile and other sensorial alert.

20. The system of claim 14, further comprising detectors communicatively coupled to the server and positioned at the plurality of locations of interest to detect a level of electromagnetic radiation at the location of interest.

21. A method for managing the effect of electromagnetic interference (EMI) on an electronic device, the method comprising the steps of:
   determining at a server a location of the electronic device within an environment;
   determining at the server, levels of electromagnetic radiation in a plurality of locations of interest within the environment;
   the server implementing corrective action to limit the effect of the electromagnetic radiation on the electronic device based on the location of the device and a level of electromagnetic radiation in a location of interest; and the server generating a report indicating locations to be avoided by the electronic device based on the levels of electromagnetic radiation at the plurality of locations of interest.

22. The method of claim 21, further comprising a step of classifying locations of interest within the environment into categories based on their respective levels of electromagnetic radiation.

23. The method of claim 21, further comprising a step of determining whether a level of electromagnetic radiation in the location of interest is approaching or exceeding a recommended threshold for the electronic device.

24. The method of claim 21, wherein the corrective action comprises directing the user to a safe location or other location having a lower level of electromagnetic radiation.

25. The method of claim 21, wherein the method steps are implemented by computer program code configured to execute on a processor.

26. A method for managing the effect of electromagnetic interference (EMI) on an electronic device, the method comprising the steps of:
   determining at a server a location of the electronic device within an environment;
   determining at the server, levels of electromagnetic radiation in a plurality of locations of interest within the environment;
   the server implementing corrective action to limit the effect of the electromagnetic radiation on the electronic device based on the location of the device and a level of electromagnetic radiation in a location of interest; and
   the server analyzing electromagnetic radiation patterns in one of the plurality of locations of interest and identifying a device contributing to the electromagnetic radiation pattern.

27. The method of claim 26, further comprising a step of classifying locations of interest within the environment into categories based on their respective levels of electromagnetic radiation.

28. The method of claim 26, further comprising a step of determining whether a level of electromagnetic radiation in the location of interest is approaching or exceeding a recommended threshold for the electronic device.

29. The method of claim 26, wherein the corrective action comprises directing the user to a safe location or other location having a lower level of electromagnetic radiation.

30. The method of claim 26, wherein the method steps are implemented by computer program code configured to execute on a processor.

31. A server based electromagnetic interference (EMI) management system, the server comprising a computer readable storage medium having computer readable program code functions stored therein for causing the server to manage EMI, the computer readable program code comprising:
   a first computer readable program code configured to determine a location of an electronic device within an environment;
   a second computer readable program code configured to determine a level of electromagnetic radiation in at least one of a plurality of locations of interest within the environment;
   a third computer readable program code configured to implement corrective action to limit the effect of the electromagnetic radiation on the electronic device based on the location of the device and the level of electromagnetic radiation in the at least one location of interest; and
   further comprising one or more data repositories accessible by the second computer readable program code and configured to store device data, wherein said device data comprises an electromagnetic signature of the device.

32. The system of claim 31, further comprising one or more data repositories accessible by the second computer readable program code and configured to store location data, device data and subject data.

33. The system of claim 31, wherein said third computer readable program code is configured to cause a second device to at least one of: change its operating characteristics, be shut down, be disabled, and be rescheduled for operation at a different time.

34. The system of claim 31, wherein said third computer readable program code is configured to generate an alert, wherein the alert comprises at least one of: a message to personnel to power down, disable or change the operating characteristics of an offending device; a message to personnel to intercept the device user; a message to the device user that they are in or nearing an area of higher-than desired levels of electromagnetic radiation.

35. The system of claim 31, wherein the alert comprises at least one of an audible, visual, tactile and other sensorial alert.

* * * * *